(12) United States Patent
Tanielian

(10) Patent No.: US 7,915,144 B2
(45) Date of Patent: Mar. 29, 2011

(54) METHODS FOR FORMING THERMOTUNNEL GENERATORS HAVING CLOSELY-SPACED ELECTRODES

(75) Inventor: Minas H. Tanielian, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 304 days.

(21) Appl. No.: 12/048,897

(22) Filed: Mar. 14, 2008

(65) Prior Publication Data

US 2008/0155981 A1 Jul. 3, 2008

Related U.S. Application Data

(62) Division of application No. 10/652,449, filed on Aug. 29, 2003, now abandoned.

(60) Provisional application No. 60/460,457, filed on Apr. 3, 2003.

(51) Int. Cl.
*H01L 21/326* (2006.01)
*H01L 21/479* (2006.01)

(52) U.S. Cl. .......................... 438/468; 438/88; 438/351

(58) Field of Classification Search .................. None
See application file for complete search history.

(56) References Cited

U.S. PATENT DOCUMENTS

| | | | |
|---|---|---|---|
| 3,169,200 A | 2/1965 | Huffman | |
| 3,515,908 A | 6/1970 | Caldwell | |
| 4,004,210 A | 1/1977 | Yater | |
| 4,667,126 A | 5/1987 | Fitzpatrick | |
| 5,675,972 A | 10/1997 | Edelson | |
| 5,699,668 A | 12/1997 | Cox | |
| 5,722,242 A | 3/1998 | Edelson | |
| 5,810,980 A | 9/1998 | Edelson | |
| 5,874,039 A | 2/1999 | Edelson | |
| 5,981,071 A | 11/1999 | Cox | |
| 5,994,638 A | 11/1999 | Edelson | |
| 6,064,137 A | 5/2000 | Cox | |
| 6,089,311 A | 7/2000 | Edelson | |
| 6,103,298 A | 8/2000 | Edelson et al. | |
| 6,117,344 A | 9/2000 | Cox et al. | |
| 6,214,651 B1 | 4/2001 | Cox | |

(Continued)

FOREIGN PATENT DOCUMENTS

WO    WO9913562 A1    3/1999

OTHER PUBLICATIONS

Hishinuma et al., "Refrigeration by combined tunnuling and thermionic emission in vacuum: Use of a nanometer scale design", Applied Physics Letters, American Institute of Physics, Apr. 23, 2001, pp. 2572-2574, New York.

*Primary Examiner* — Zandra Smith
*Assistant Examiner* — Pamela E Perkins

(57) ABSTRACT

The present disclosure relates to methods of forming solid state thermal engines that provides a closely-spaced thermal tunneling gap between a hot and cold electrode. The effective gap may be on the order of one nanometer. In one embodiment, a via is etched through a first side of first and second substrates, and metal electrodes are attached to a second side of the first and second substrates. The second sides are opposite the first sides. The metal electrodes are mated by bonding the second side of the first substrate to the second side second substrate. The gap may be formed by applying a voltage greater than a threshold voltage across the mated electrodes.

23 Claims, 8 Drawing Sheets

U.S. PATENT DOCUMENTS

| | | |
|---|---|---|
| 6,229,083 B1 | 5/2001 | Edelson |
| 6,281,139 B1 | 8/2001 | Tavkhelidze et al. |
| 6,281,514 B1 | 8/2001 | Tavkhelidze |
| 6,294,858 B1 | 9/2001 | King et al. |
| 6,417,060 B2 | 7/2002 | Tavkhelidze et al. |
| 6,495,843 B1 | 12/2002 | Tavkelidze |
| 6,531,703 B1 | 3/2003 | Tavkhelidze |
| 6,720,704 B1 | 4/2004 | Tavkhelidze et al. |
| 6,876,123 B2 | 4/2005 | Martinovsky et al. |
| 6,946,596 B2 | 9/2005 | Kucherov et al. |
| 7,557,487 B2 * | 7/2009 | Tanielian ............ 310/306 |
| 2003/0042819 A1 | 3/2003 | Martinovsky et al. |
| 2004/0195934 A1 | 10/2004 | Tanielian |
| 2006/0162761 A1 | 7/2006 | Tanielian |
| 2007/0023077 A1 | 2/2007 | Tanielian |

* cited by examiner

Etched Vias 142

METHODS FOR FORMING THERMOTUNNEL GENERATORS HAVING CLOSELY-SPACED ELECTRODES

CROSS REFERENCE TO RELATED APPLICATIONS

This patent application is a divisional application of co-pending, commonly-owned U.S. patent application Ser. No. 10/652,449 entitled "Solid State Thermal Engine" filed on Aug. 29, 2003, which claims priority from U.S. Provisional Application No. 60/460,457 filed Apr. 3, 2003, which applications are incorporated herein by reference.

FIELD OF THE DISCLOSURE

This disclosure relates generally to electrical power generation and, more specifically, to direct thermal-to-electric energy conversion power generating systems.

BACKGROUND OF THE DISCLOSURE

Complex Solid state thermal engines are devices that perform direct thermal-to-electric energy conversion without any moving parts. The solid state thermal engine is driven by hot sources, such as engine bleed air, wasted heat from operation of an electromechanical or thermal system, or some other heat source, such as the sun.

Solid state thermal engine technology is based on thermionics. Thermionics originated nearly a century ago with a basic vacuum tube, a device that consisted of two parallel conductive plates (a high temperature cathode and a low temperature anode) separated by a vacuum gap. During operation electrons boil off the cathode, traverse the gap and then are absorbed into the colder anode. The conversion of heat to electricity occurs as the electrons' kinetic energy results in a net current between the anode and cathode. These early vacuum gap designs have high manufacturing costs and high operating temperatures—above 1000° C., and require a very small gap for operation, on the order of hundreds of nanometers.

FIG. 1 illustrates an example solid state thermal engine that includes a cold electrode (B) and a hot electrode (A) separated by a gap. According to theoretical models, an alternative to conventional thermoionics is a device that relies on the effect of quantum mechanical tunneling which can occur between two electrodes, when the gap is between 1-10 nanometers. However, there are currently no devices that utilize a gap size in the one to ten nanometer range, for energy generation, even though there have been some claims in the literature to this effect.

Therefore, there exists an unmet need in the art to cost-effectively produce a solid state thermal engine that operates at much lower temperatures and at much higher efficiencies.

SUMMARY

The present disclosure provides methods for creating a solid state thermal engine that includes an effective gap between hot and cold electrodes using at least one of an applied voltage or current. The effective gap may be on the order of a few nanometers (nm). The resulting solid state thermal engine is configured to convert thermal energy into electrical energy.

In one embodiment, a method includes forming a via through first sides of first and second substrates, and attaching metal electrodes to second sides of the first and second substrates. The metal electrodes are aligned and the second sides of the first and second substrates are bonded. At least one of a voltage or a current is applied across the mated electrodes to form an effective gap between the two electrodes.

The features, functions, and advantages that have been described above or will be discussed below can be achieved independently in various embodiments, or may be combined in yet other embodiments, further details of which can be seen with reference to the following description and drawings.

BRIEF DESCRIPTION OF THE DRAWINGS

Embodiments of the present disclosure are described in detail below with reference to the following drawings.

DETAILED DESCRIPTION

The present disclosure provides a solid state thermal engine and a method for creating a solid state thermal engine that includes an effective gap between hot and cold electrodes. The gap is preferably on the order of one or two nanometers (nm). Many specific details of certain embodiments of the disclosure are set forth in the following description and in FIGS. 2-13 to provide a thorough understanding of such embodiments. One skilled in the art will understand, however, that the present disclosure may have additional embodiments, or that the present disclosure may be practiced without several of the details described in the following description.

Figure 1:
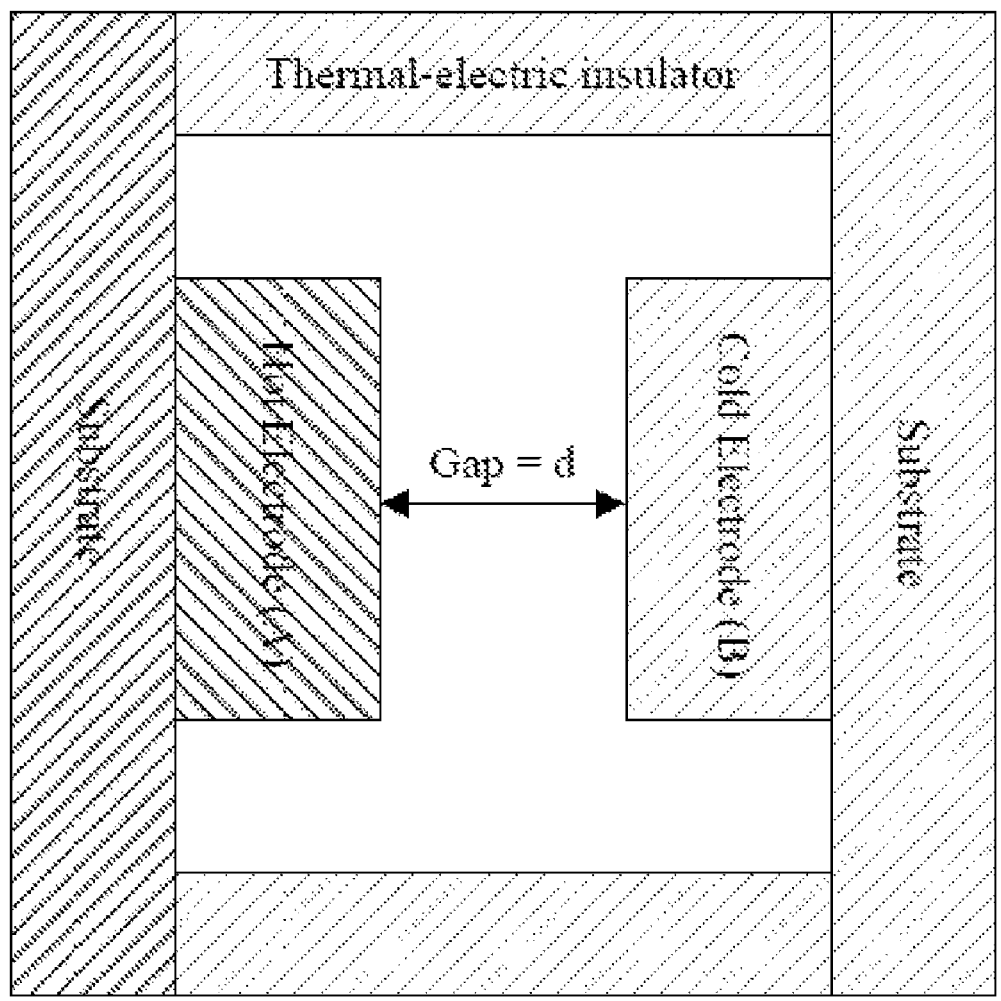
FIG. 1 is a cross-sectional view of a solid state thermal engine according to the prior art.
Figure 2:
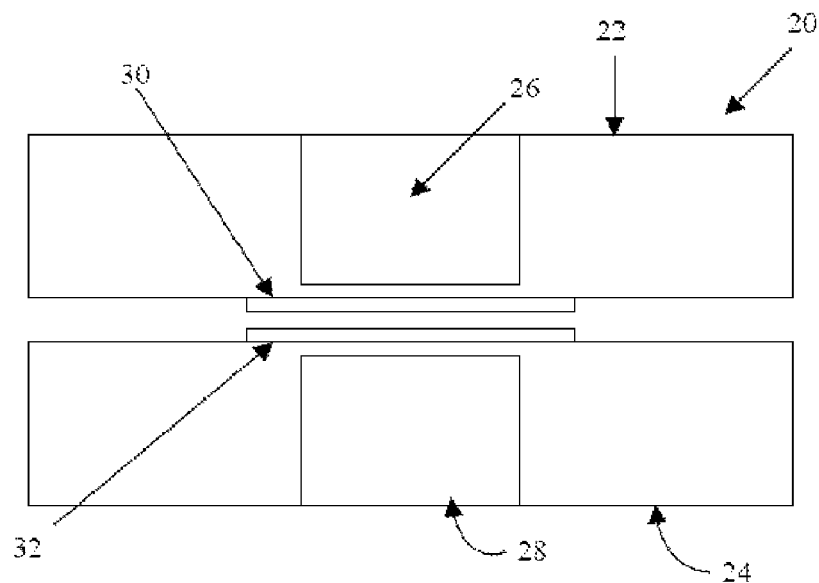
FIGS. 2 and 3 are side cross-sectional views of a solid state thermal engine formed in accordance with one embodiment of the present disclosure.
Figure 3:
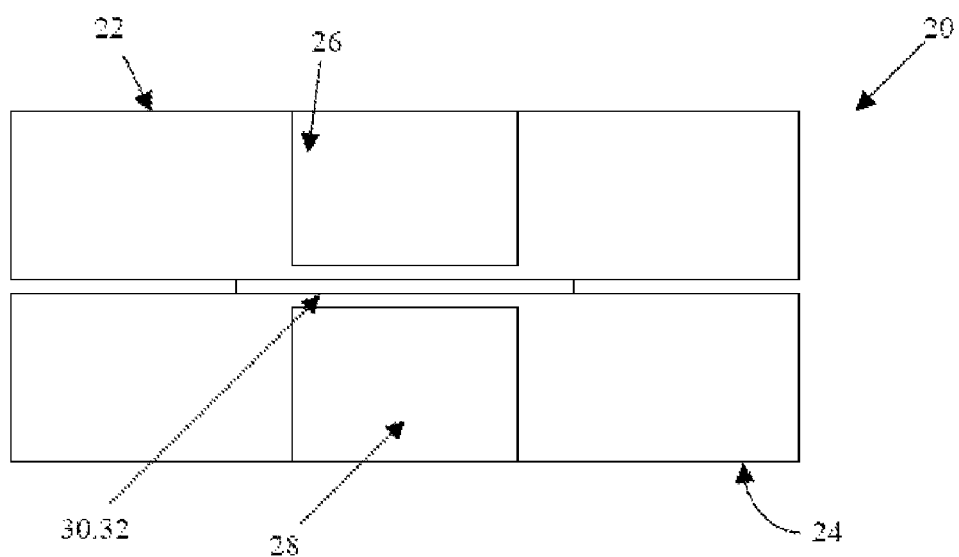

FIGS. 2 and 3 illustrate an exemplary solid state thermal engine 20 formed in accordance with the present disclosure. The thermal engine 20 includes a cold portion 22 and a hot portion 24. The cold and hot portions 22 and 24, respectively, are formed from glass and include etched vias 26 and 28. Metal pads 30 and 32 that suitably include a metal, such as without limitation Au, Pt, Pd, Ag, Si, W, or Cr, each of which may have a very thin layer (submonolayer or monolayer) of a low work function of a metal, such as Cs on their surface, are applied (that is, deposited or sputtered) on portions of wafers 22 and 24, opposite respective etched vias 26 and 28.

As shown in FIG. 3, the two wafers 22 and 24, respectively, are bonded according to known bonding processes. Because of the type of metal used for the metal pads 30 and 32, the bonding process of the glass (used for the cold and hot portions 22 and 24, respectively) that occurs as low a temperature as room temperature and typically between 250 to 450° C.

does not homogenize the interface between the metal pads 30 and 32. An incomplete but intimate bond between the two layers of metal pads 30 and 32 is thereby created, most likely having very small voids on the order of a nanometer or smaller. Subsequent to this process, the intervening glass material is removed and a metal layer is applied on both opposing vias. Finally, a voltage or current is applied between these two electrodes, such that when a threshold value is exceeded, a nanometer sized gap (or an effective gap) is formed at the interface between the two electrodes, due to Joule heating and electromigration effects.

Figure 4:
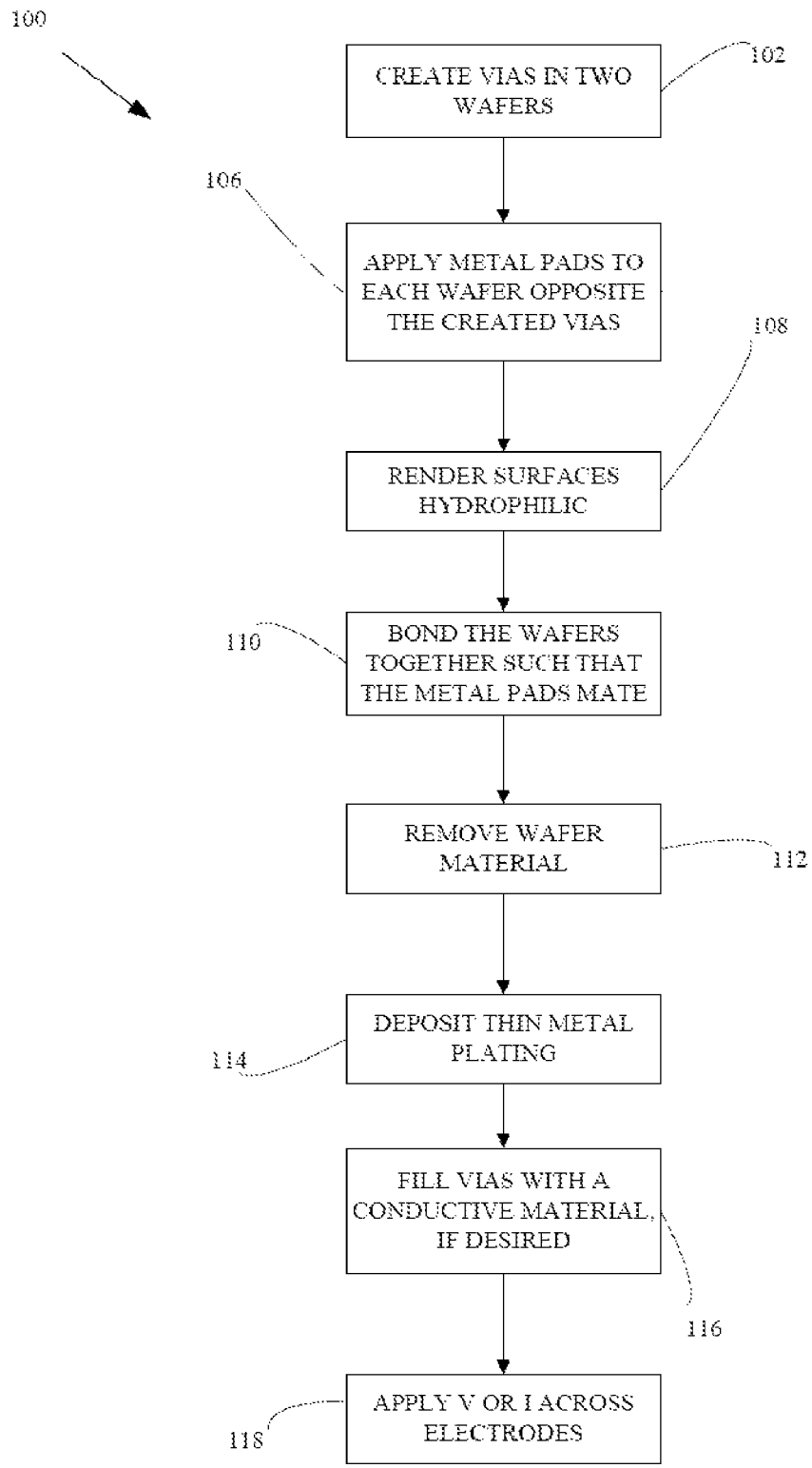
FIG. 4 is a flow diagram of a process for making a solid state thermal engine according to the present disclosure.

FIG. 4 illustrates one process 100 for forming a solid state thermal engine in accordance with one embodiment of the present disclosure. First, at a block 102, one or more vias are etched into two wafers, such as without limitation glass, $SiO_2$ or silicon wafers with a high thermal resistance coating. A thin membrane of the wafer material is left between the etched via and a front surface of the wafer or as in the case of the silicon wafer which is used as a sacrificial material a thin membrane of the high thermal resistance coating. For example without limitation, the size of the membrane may be on the order of 25-30 micrometers.

At a block 106, a metal pad of approximately 100 nanometers is deposited or sputtered on the front surface of each wafer opposite the etched vias. The metal pads will serve as electrodes. At a block 108, the front surfaces of the wafer are treated according to known methods in order to render the front surfaces hydrophilic. At a block 110, two wafers formed according to the steps 102-108 are bonded, such that the metal pads mate. Bonding of the wafers (such as $SiO_2$ wafers, oxidized silicon wafers) generally occurs at room temperature but typically is followed by a heating step at 250-450° C. and is suitably performed in a vacuum oven in order to increase the bonding strength of the two wafers. It will be appreciated that wafers can be bonded if the surfaces have either a hydrophilic or hydrophobic surface. It will also be appreciated that other known methods of bonding the two wafers can also provide an acceptable bond between the two wafers.

At a block 112, the wafers are etched from both sides to remove the remaining wafer material adjacent to the metal film pads within the vias. In one embodiment, if the metal film pads are Au, a thickness of generally 100 nm and 1.0 mm in diameter is used to provide enough mechanical integrity to withstand the removal of the adjacent wafer material. Next, at a block 114, a metal layer is deposited by an acceptable method such as evaporation, sputtering, or sputtering followed by plating on both sides of the metal electrodes within the vias. The seed metal layer is suitably a Cu or Au film that is on the order of approximately 200 nm thick. Preferably, the total thickness of the metal layer deposited is at least 10 micrometers thick. This is shown by example in FIG. 8.

At a block 116, the etched, plated vias are filled with a conductive material if a higher conductivity is desired. In one embodiment, the conductive material is a soft solder type material. Other materials, such as high temperature solders can also be used to fill the vias.

At a block 118, a constant voltage or constant current that exceeds a predefined value is applied through or across the electrodes in order to form a nano-gap between the two thin metal film electrodes. Examples of the predefined voltage and current values are a voltage of 2V or a current of several hundred milliamperes. When a voltage is applied across the electrodes, Joule heating and strong electromigration effects take place. Joule heating is the heat which is evolved when current flows through a medium having electrical resistance, as given by Joule's law. Electromigration drives atoms along grain boundaries in polycrystals due to the presence of an electric field. The result is a rearrangement of the polycrystalline structure. Electromigration effects are well known in semiconductor technology where they often lead to the creation of voids in integrated circuit interconnects, thus causing them to fail.

Figure 5:
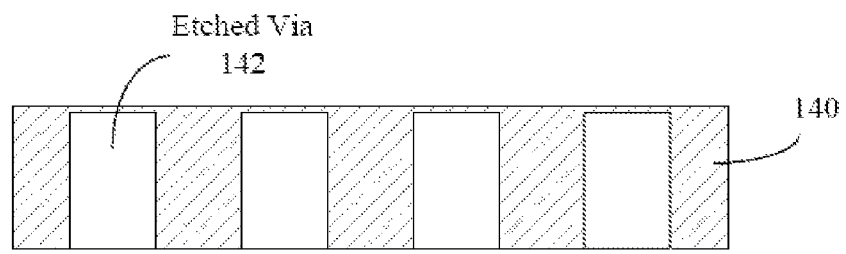
FIGS. 5-9 are side cross-sectional views of a solid state thermal engine formed using the process shown in FIG. 4.
Figure 6:
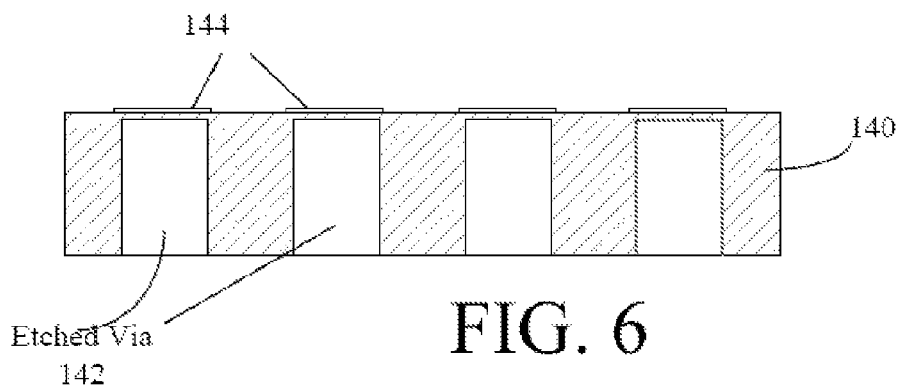
Figure 7:
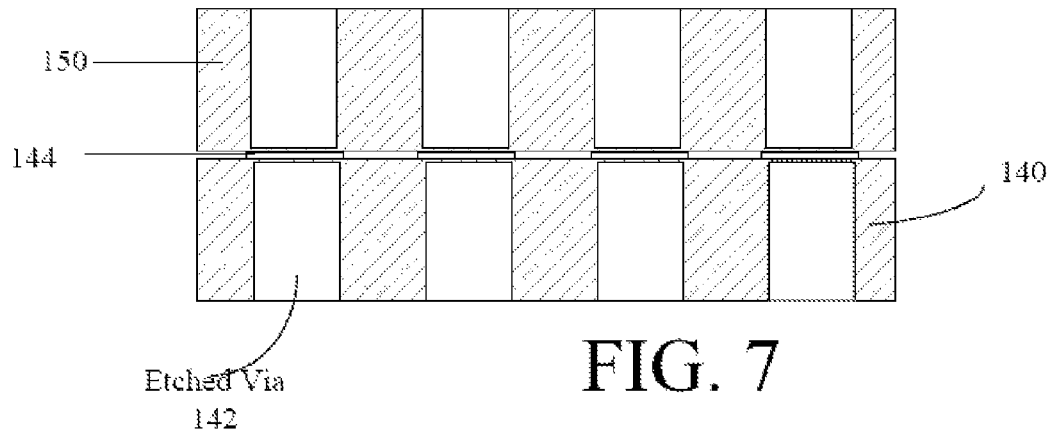
Figure 8:
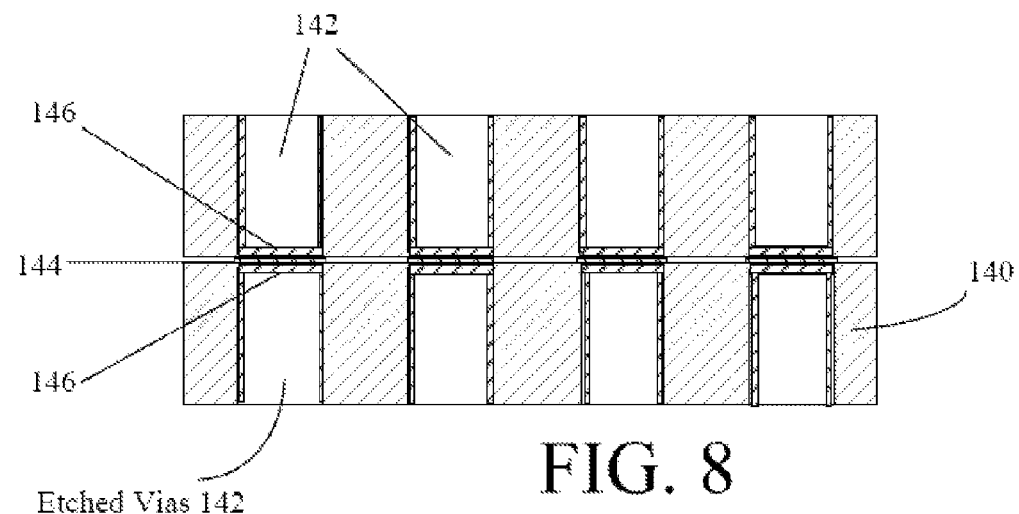
Figure 9:
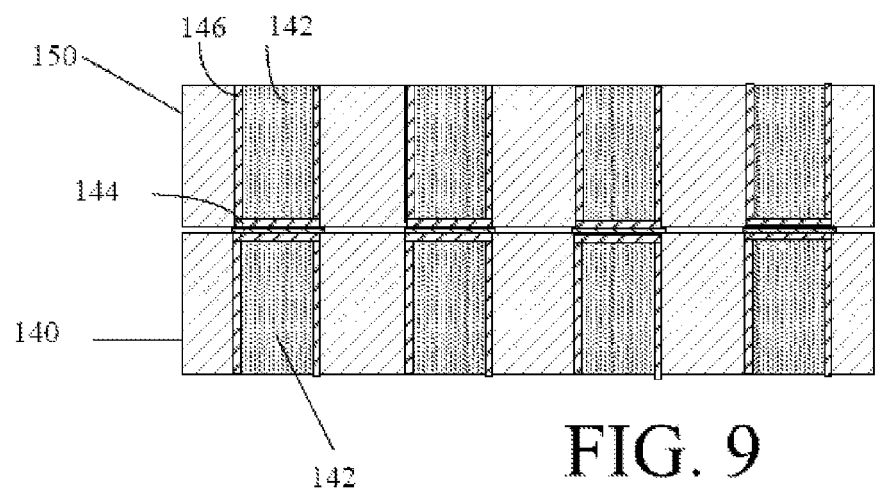

FIG. 5 illustrates a cross-sectional view of a wafer 140 after vias 142 have been etched at the block 102 (FIG. 4). FIG. 6 illustrates the wafer 140 after thin metal electrodes 144 have been deposited opposite the etched vias 142 at the block 106 (FIG. 4). A non-limiting example of the deposited thin metal pad can be made of 50 Å of Cr and 1000 Å of Au. FIG. 7 illustrates two wafers 140 and 150 with electrodes 144 located between the vias 142 after the wafers 140 and 150 have been bonded at the block 110 (FIG. 4). FIG. 9 illustrates vias 142 that are filled with a conductive material at the block 116 (FIG. 4).

Figure 10A:
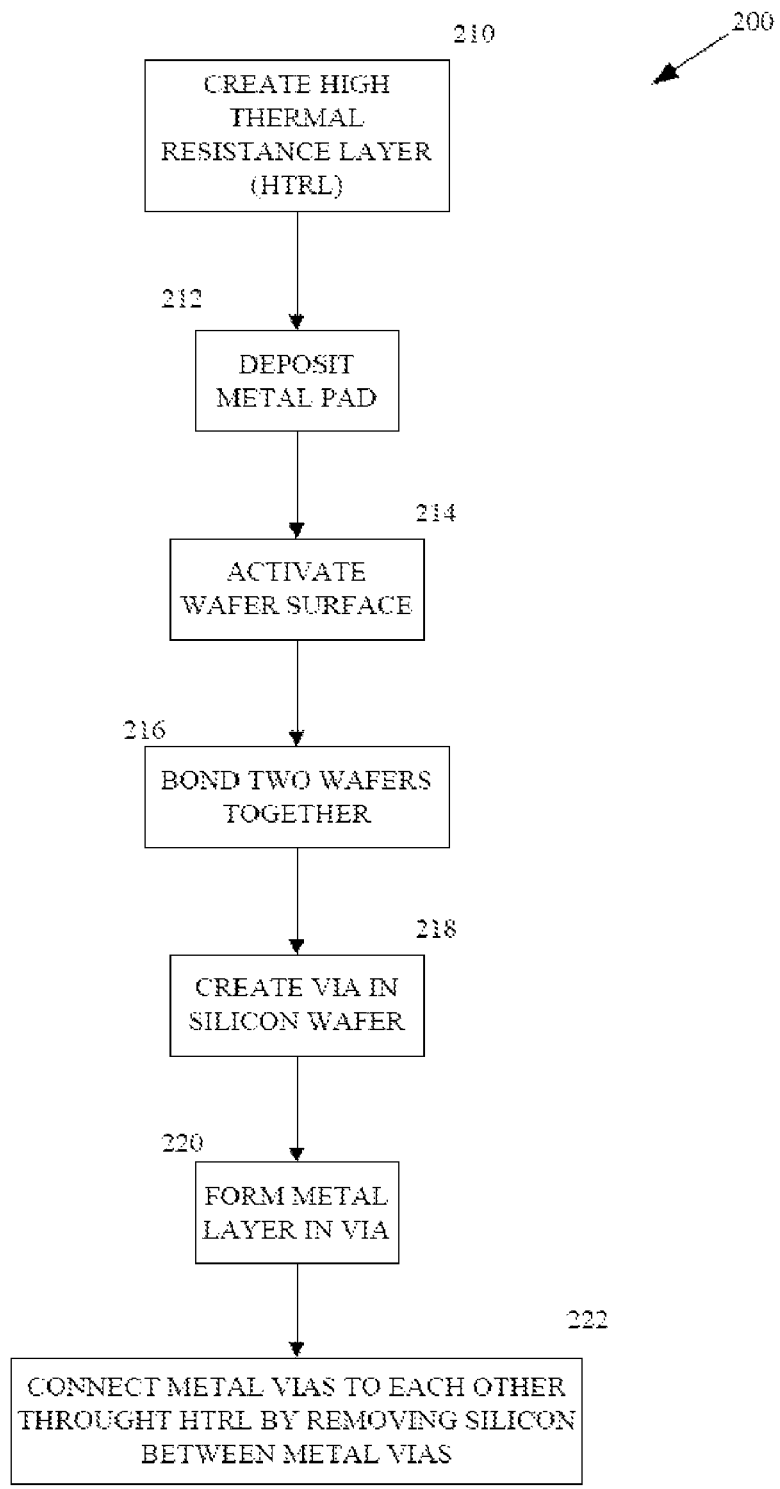
FIG. 10A is a flow diagram of an alternate process for making a solid state thermal engine according to the present disclosure.

FIG. 10A illustrates an alternate process 200 for forming a solid state thermal engine in accordance with the present disclosure. In block 210, a high thermal resistance layer is grown or deposited on a silicon wafer such as $SiO_2$ or a combination of materials such as $SiO_2$ and $Al_2O_3$. Then in block 212, a metal pad is deposited on a first edge of each wafer. The metal pad may suitably include metals such as without limitation Au, Pt, Pd, Ag, Si, W, or Cr, with a very thin layer of a low work function metal such as Cs on its surface (that is, deposited or sputtered).

At a block 214, the wafer surfaces having the metal pad deposited on them are activated using a short duration oxygen plasma or through a chemical treatment to render them without limitation hydrophilic or hydrophobic. Subsequently, in block 216, the two wafers as discussed above are bonded together at their first edges. In block 218, a via is etched on each second surface of the bonded silicon wafers, opposite to the first surfaces bonded at block 216 that terminates at the metal pad layer deposited on block 212, such as without limitation using chemical means or reactive ion etching. During the course of via etching in block 218 both silicon and the high thermal resistance layer at the bottom of the via adjacent to the metal pad is removed. The via suitably includes two walls that slant inward from a first edge of the Silicon wafer. At a block 220, a metal, such as without limitation Cr, Cu or Au, is sputtered within the etched via, thereby forming a metal layer. The thickness of this metal layer can be further augmented through electroplating techniques to have at least a thickness of 10 micrometers. At a block 222, the silicon material which exists between the metal plated vias is removed. At this stage the metal plated vias are physically connected to each other through the remaining high thermal resistance layer.

Figure 10B:
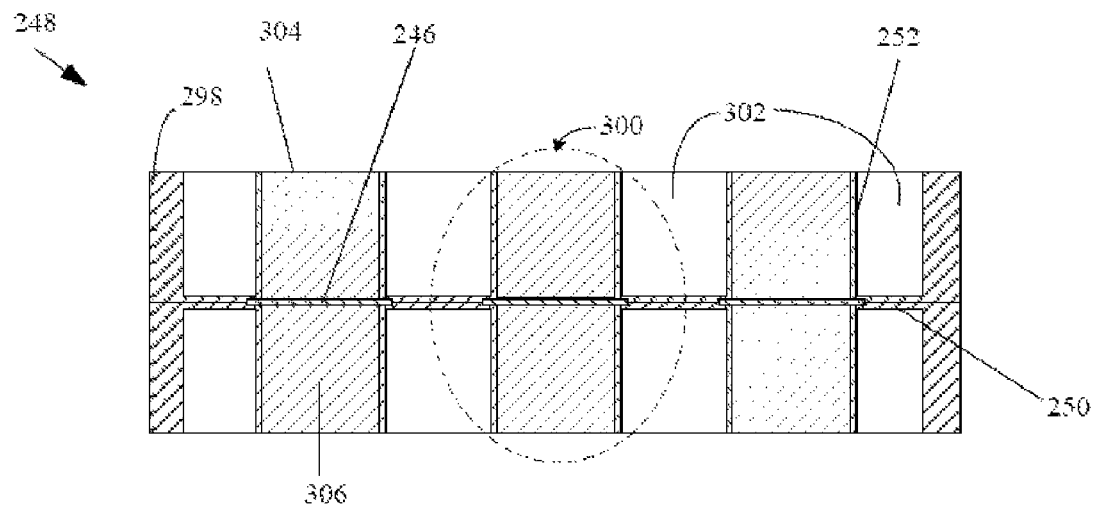
FIG. 10B illustrates side cross-sectional views of a solid state thermal engine formed using the alternate process of FIG. 10A.

FIG. 10B illustrates a cross-sectional view of a pair of bonded Silicon wafers 248. A via 304 is etched into the Silicon wafer 298 at the block 218 (FIG. 10A) that terminates at the metal pad layer 246 deposited including without limitation Au, Pt, Pd, Ag, Si, W, or Cr, with a very thin layer of a low work function metal such as Cs on its surface (that is, deposited or sputtered). The via is etched using without limitation chemical or reactive ion etching methods. The via 304 is plated without limitation with Au or Cu, at the block 220 (FIG. 10A). The two wafers formed as shown by the wafer pair 248 are bonded together at their second edges 250 at the block 216 (FIG. 10A). Prior to bonding, the surfaces of each wafer 298 are activated (such as without limitation hydrophilic or hydrophobic) at block 214 (FIG. 10A) in order to bond during the bonding process at the block 216 (FIG. 10A). Finally, the via 304 can be filled with a solder-like material 306. A quantum tunneling device is then formed between the second surface of each wafer through the gap between the two surfaces 246, created by Joule heating and electromigration, when a suitable current or voltage is applied between surfaces 304.

Figure 11:
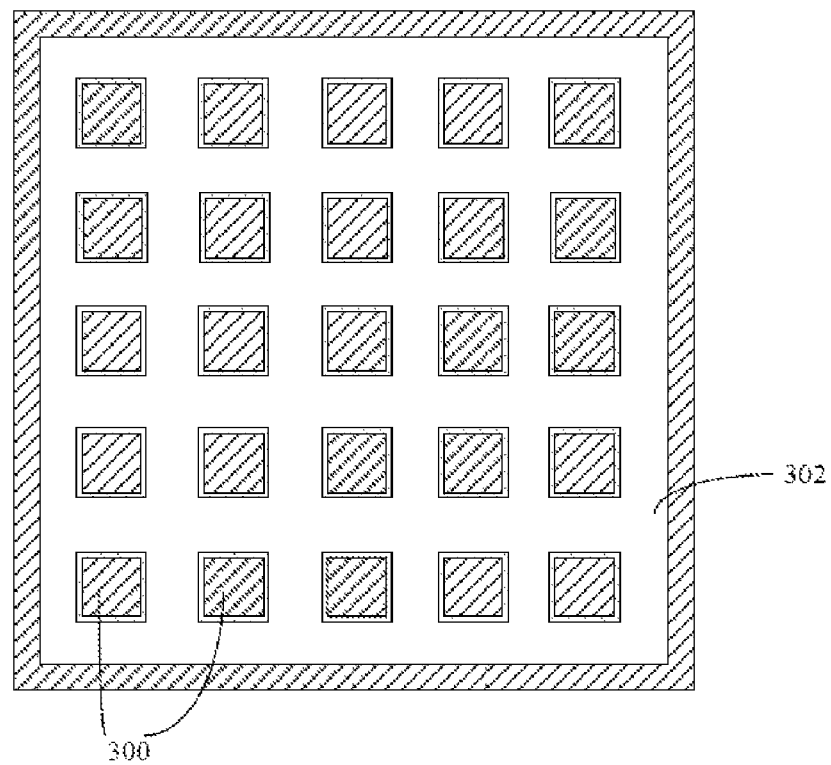
FIGS. 11 and 12 are cross-sectional views of a solid state thermal engine formed in accordance with another embodiment of the present disclosure.

FIG. 11 illustrates a top view of one side of a solid state thermal engine device 248 made of individual via pairs 300 (also in FIG. 10B) similar to that shown in FIG. 9 except that most of the wafer material 140, 150 located in between each created thermal tunneling unit 300 (filled vias and electrode pairs) is removed in order to increase the overall efficiency of the device 248 (FIG. 9) by minimizing the thermal path between a hot side 304 and a cold side 306 of the device 248. In other words, a large ΔT is maintained between the front and back surfaces. By removing the wafer material, wells 302 are created. The wells 302 reduce the amount of material present between the front and back surfaces and effectively increase the thermal resistance of the device 248. The wells 302 also minimize the heat flow between the front and back surfaces of the device 298. The only pathway between the hot and cold side of the device in addition to quantum tunneling through the gap is through the high thermal resistance layer 250.

Figure 12:
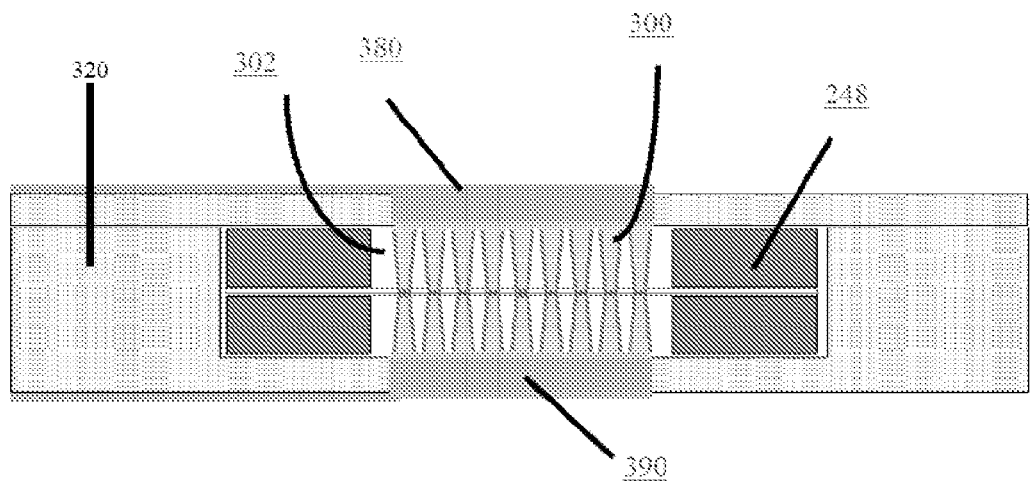
Figure 13:
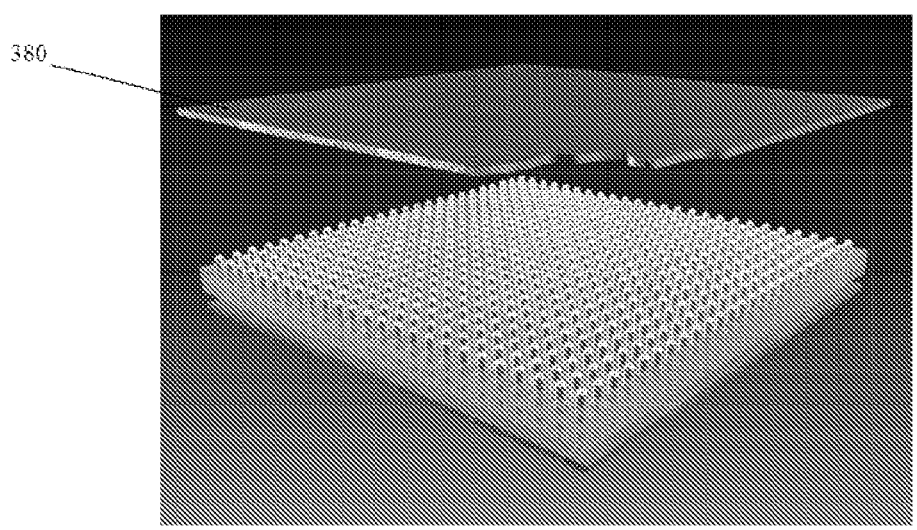
FIG. 13 is a side cross-sectional view of a solid state thermal engine formed in accordance with still another embodiment of the present disclosure.

FIG. 12 illustrates a packaging configuration of the solid state thermal engine 248 that includes a plurality of solid state thermal tunneling (engine) units 300 separated from each other by etched wells 302. The device has been inserted in a high thermal resistance material package, such as a ceramic material 320. Hot 380 and cold 390 electrodes on each side of the thermal engine provide electrodes for the electrical power output from this device. FIG. 13 illustrates an embodiment of the device where a large number of thermal tunneling units 300 created thereon. This can increase the power output of the device while lowering its cost. The starting wafer material of the device 248 is suitably Si.

In an alternate embodiment, a gap between the electrode on the hot side and the electrode on the cold side is created through volume shrinkage during a solid state reaction. Volume shrinkage occurs during the formation of silicides when silicon and different metals are combined. Larger volume shrinkage occurs during the formation of disilicides. In a non-limiting example, each electrode includes equal amounts of a metal and silicon films, such as without limitation Ni and Si. Prior to bonding of two wafers (i.e., a hot side to a cold side), the electrodes are suitably annealed in a vacuum at generally 350° C. for 30 minutes. In the annealing process, the Ni and Si react to form NiSi. Before the two wafers are bonded a thin layer of silicon is applied to either or both wafer surfaces on top of the NiSi layer, in sufficient quantity to form a $NiSi_2$ film. When the two wafers are bonded in a manner described above at generally 450° C., the NiSi reacts with the Si in the wafer to form a $NiSi_2$. As a result, overall volume is reduced at the interface between the Ni and Si, and a number of nano-voids are created at the interface therebetween.

In an alternate embodiment, the annealing step is followed by Joule heating to perform electromigration. During Joule heating, the current concentrates in areas where there is a filamentary connection between the two metallic $NiSi_2$ surfaces Si. The electromigration at the filamentary connections further heats the $NiSi_2$ which further promotes disilicide creation and thus a gap. The current or voltage applied is terminated when a desired size gap is formed, which can be assessed by the resistance of the gap.

The cooling efficiency of a solid state thermal engine device could in principle come very close to the Carnot limit, which is a theoretical limit on the efficiency of an engine based on the flow of heat between two reservoirs. To get close to the Carnot limit, the active area of the device is as large as possible and the junction gap is on the order of 1-5 nm, depending on the work function of the electrode materials used. One of the ways to increase the efficiency of this device is to introduce low work function materials at the nano-gap surfaces (i.e., electrodes). The work function is the minimum energy needed to remove an electron from the Fermi level of a metal to infinity and is usually expressed in electronvolts (eV). In one embodiment, a lower work function is suitably obtained by depositing alkalis onto metals having higher work functions, such as Au. Alkali metals such as Cs in sub-monolayer coverage produce work functions that are lower than the values of the alkali metals in bulk form. An alkali layer can be evaporated onto a thin metal film or can be introduced as an impurity on the surface of the underlying metal in order to reduce the work function of the electrodes.

While various embodiments of the disclosure has been illustrated and described, as noted above, many changes can be made without departing from the spirit and scope of the disclosure. Accordingly, the scope of the disclosure is not limited by the disclosure of the preferred embodiment. Instead, the disclosure should be determined entirely by reference to the claims that follow.

What is claimed is:

1. A method of making a solid state thermal engine device for converting thermal energy into an electric current, the method comprising:
   forming a via through first sides of first and second substrates;
   attaching metal electrodes to second sides of the first and second substrates, wherein the second sides are opposite the first sides;
   mating the metal electrodes by bonding the second side of the first substrate to the second side of the second substrate to form a solid state thermal engine device; and
   applying at least one of a voltage or a current across the mated electrodes to form an effective gap between the two electrodes.

2. The method of claim 1, wherein at least one of the metal electrodes include a base metal and a metal deposited on the surface of the base metal, wherein the deposited metal cause the metal electrode to have a work function that is lower than the work function of the base metal.

3. The method of claim 2, wherein the base metal includes one or more of Au, Pt, Pd, Ag, Si, W, or Cr.

4. The method of claim 3, wherein the deposited metal includes at least one of Cs or CsO.

5. The method of claim 1, wherein the effective gap is on the order of one nanometer.

6. The method of claim 1, wherein applying at least one of a voltage or a current across the mated electrodes includes applying at least one of a voltage or a current across the mated electrodes that is greater than a predefined threshold.

7. The method of claim 1, wherein the first and second substrates include glass.

8. The method of claim 1, wherein the first and second substrates include $SiO_2$.

9. The method of claim 1, wherein the first and second substrates include Si.

10. The method of claim 1, further comprising generating a plurality of mated metal electrode pairs.

11. The method of claim 10, further comprising generating wells between each mated metal electrode pair.

12. The method of claim 1, further comprising: removing substrate that is adjacent to the metal electrode within the via.

13. The method of claim 12, wherein the metal plating includes one of Cr, Cu, or Au.

14. The method of claim 12, further comprising applying a metal protective layer over the applied metal plating.

15. The method of claim 14, wherein the metal protective layer includes one of Cr or Au.

16. The method of claim 14, further comprising applying a conductive material adjacent to the metal protective layer within the via.

17. The method of claim 1, wherein the metal electrodes include an alkali.

18. The method of claim 1, wherein the first and second electrodes include Si and a metal and further comprising annealing the metal electrodes.

19. The method of claim 1, further comprising attaching two or more solid state thermal engine devices together.

20. The method of claim 19, wherein attaching includes attaching in one of a parallel or serial connection.

21. A method for cooling and converting thermal energy into an electric current, the method comprising:
   etching a via through first sides of first and second substrates;
   attaching metal electrodes to second sides of the first and second substrates, wherein the second sides are opposite the first sides;
   mating the metal electrodes by bonding the second side of the first substrate to the second side of the second substrate;
   applying at least one of a voltage or a current across the mated electrodes to form an effective gap between the two electrodes to form a solid state thermal engine device; and
   connecting one of the metal electrodes to a first surface and the other metal electrode to a second surface.

22. The method of claim 21, wherein the first surface has larger thermal energy than the second surface, and the connection with the electrodes causes a reduction in the thermal energy of the first surface.

23. A method of making a solid state thermal engine device for converting thermal energy into an electric current, the method comprising:
   mating hot and cold conductive electrodes of the device; and
   applying a voltage across the mated electrodes to form a nano-gap between the conductive electrodes.

* * * * *